United States Patent [19]
Lo et al.

[11] Patent Number: 5,617,297
[45] Date of Patent: Apr. 1, 1997

[54] ENCAPSULATION FILLER TECHNOLOGY FOR MOLDING ACTIVE ELECTRONICS COMPONENTS SUCH AS IC CARDS OR PCMCIA CARDS

[75] Inventors: Randy Lo, Campbell; Hem P. Takiar, Fremont, both of Calif.

[73] Assignee: National Semiconductor Corporation, Santa Clara, Calif.

[21] Appl. No.: 533,118

[22] Filed: Sep. 25, 1995

[51] Int. Cl.$^6$ ................................ H05K 1/14; H05K 1/03
[52] U.S. Cl. ................ 361/737; 361/752; 361/736; 361/816; 361/760; 174/52.2; 257/787; 257/789
[58] Field of Search ........................ 361/737–739, 361/752, 684, 816, 749, 760, 820, 736; 235/487, 492; 174/52.2; 257/787, 790, 795

[56] References Cited

U.S. PATENT DOCUMENTS

| | | | |
|---|---|---|---|
| 5,208,732 | 5/1993 | Baudouin et al. | 361/386 |
| 5,319,522 | 6/1994 | Mehta | 361/748 |
| 5,406,117 | 4/1995 | Dlugokecki et al. | 257/659 |
| 5,554,821 | 9/1996 | Patterson et al. | 174/52.2 |

FOREIGN PATENT DOCUMENTS 63-104455  5/1988  Japan .

*Primary Examiner*—Leo P. Picard
*Assistant Examiner*—Anthony Dinkins
*Attorney, Agent, or Firm*—Hickman Beyer & Weaver

[57] ABSTRACT

A portable peripheral card for an electrical device is disclosed that has an injected molded housing package. In one aspect of the invention, the peripheral card has a printed circuit board, a female electrical connector, and a solid one-piece injected molded package, whereas the molding compound includes organic polymer fibers. The printed circuit board has electrical components mounted thereon and the female electrical connector is attached to the printed circuit board to permit communications between the electrical components on the printed circuit board and the electrical device. The solid one-piece package encapsulates the printed circuit board and the electrical components yet exposes a portion of the electrical connector to facilitate electrical connections between the printed circuit board and the electrical device. In one preferred embodiment, the organic polymer fibers includes at least one selected from the group consisting of cotton, cellulose, polyester and nylon. In another preferred embodiment, the portable peripheral card is a PCMCIA card. In another preferred embodiment, the filler includes silica and organic polymer fibers. Methods of manufacturing such peripheral cards are also disclosed.

29 Claims, 5 Drawing Sheets

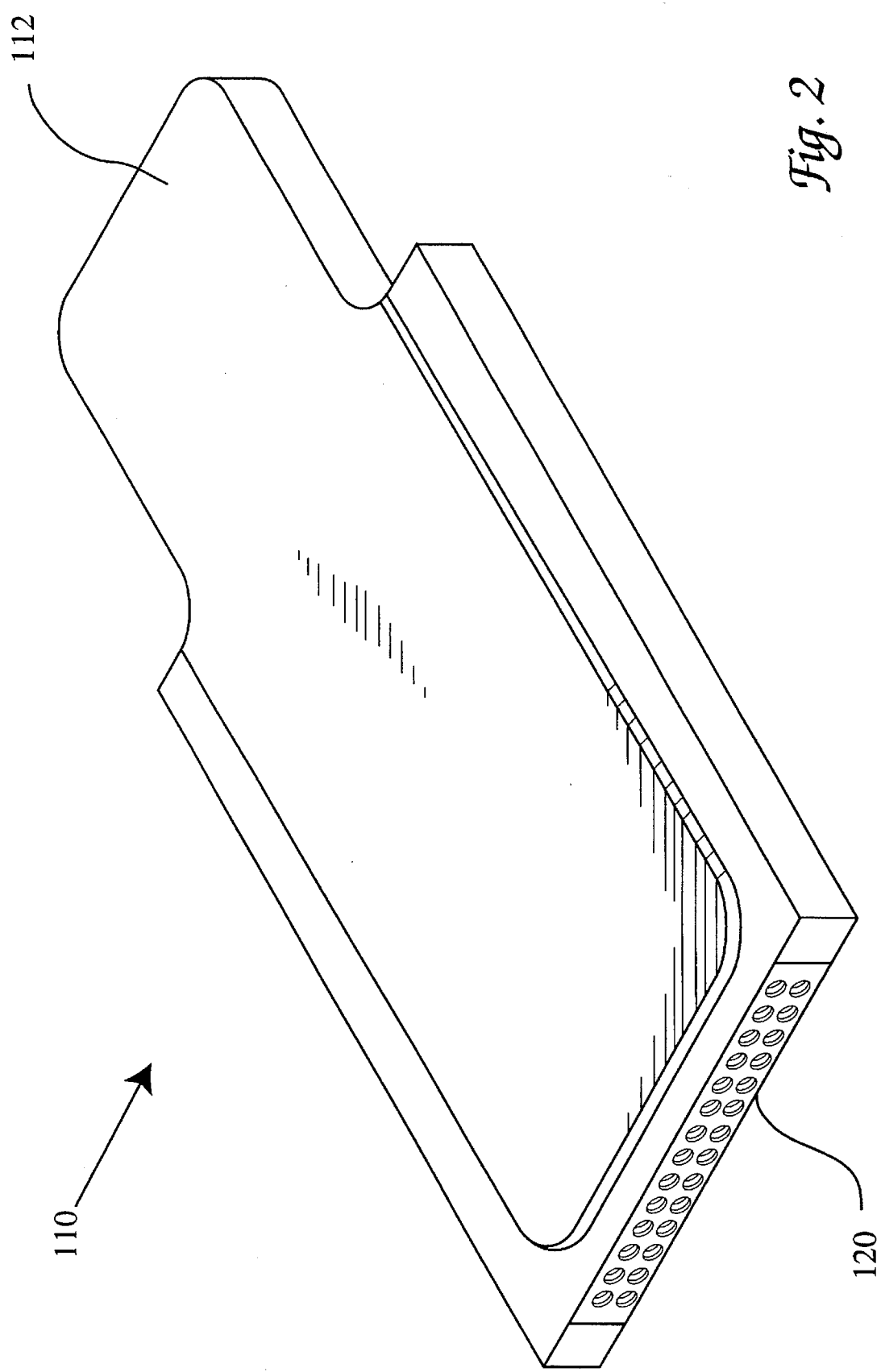

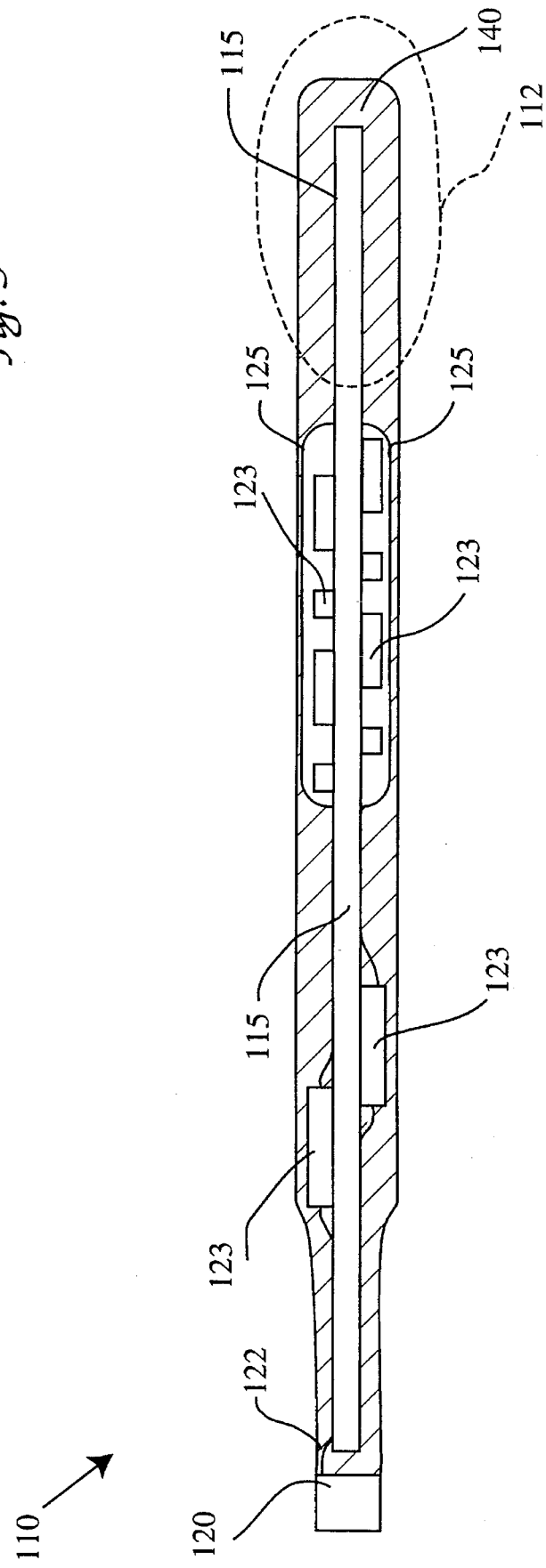

ENCAPSULATION FILLER TECHNOLOGY FOR MOLDING ACTIVE ELECTRONICS COMPONENTS SUCH AS IC CARDS OR PCMCIA CARDS

BACKGROUND OF THE INVENTION

The present invention relates generally to the packaging of portable peripheral cards and more particularly to the manufacture of peripheral cards such as PCMCIA cards having injection molded packages that are formed from a molding compound that includes an organic polymer laden filler material.

The widespread use of personal computers has brought about a subsequent demand for expansion boards to enhance theft functions. Originally, these boards were mounted internally. Thus, to replace or add new boards, one had to open the computer. However, the advent of the laptop personal computer and handheld computers brought about the development of the portable expansion board called a peripheral card. "PCMCIA", also known as PC cards, refers to an industry standard for packaging certain peripheral cards. PCMCIA cards are inserted in external slots of a laptop or handheld computer without the inconvenience of opening the computer. Their small size and portability allow easy interchange of applications by merely plugging and unplugging different peripheral cards into the external slots of the computer or other electronic device. Common applications available in PCMCIA format include modems, wireless communicators, and memory boards.

A PCMCIA card 10 constructed in a conventional fashion is depicted in FIG. 1. A printed circuit board 15 is electrically coupled to a female PCMCIA connector 20. If the card contains a wireless communicator, the card typically must include radio frequency (RF) shields 25 to prevent RF interference with the computer. The printed circuit board 15 fits in a groove or shelf in a plastic rim 30 that surrounds the circuit board. Sheet metal jackets 35 are attached to the top and bottom of the assembly to form the complete PCMCIA card 10. The metal jackets 35 do provide some RF shielding, but their primary purpose is to provide structural integrity.

Unfortunately, the process of assembling this conventional peripheral card and the assembled card itself possess certain drawbacks. First, the manufacturing process must align and attach several parts: the board, the edge connector, the plastic rim, the RF shields, and the metal jackets. This multi-stage assembly process is time consuming and labor intensive and therefore quite costly. Second, the use of a plastic rim wastes valuable printed circuit board real estate. Third, the sheet metal jackets are generally fairly flexible implying a relatively weak external protective structure for the board.

Replacing the printed circuit board's conventional package with an injected molded package is an effective solution to the preceding disadvantages. Such a portable peripheral card that includes an injected molded package is disclosed in Takiar et al.'s co-pending application Ser. No. 08/275,985 now U.S. Pat. No. 5,554,821 entitled: Removable Computer Peripheral Cards Having a Solid One-Piece Housing and Method of Manufacturing The Same filed Jul. 15, 1994 which is incorporated by reference herein in its entirety.

In conventional plastic packaged integrated circuits (ICs), the packaging material that is used in the injected mold process is often formed from a molding compound that includes a resin and filler materials. The resin is the base material of the molding compound. The resin may be either a thermoplastic or thermoset type. Filler material is added to this resin material to enhance structural integrity in IC packaging applications. Fused or crystalline $SiO_2$ (silica) or glass fibers often serve as the filler material. As well as improving the mechanical strength of the molding compound, such filler material also reduces the thermal coefficients of expansion, and, therefore, reduces the molding compound's shrinkage after molding. Small amounts of coupling agents, coloring agents, flame retardants, placticizers, and wax may also be added to optimize the molding compound as required. Additionally, hardeners and catalysts may be combined with the thermoset resin.

One potential filler material for the described molded peripheral card would naturally be silica since such fillers are commonly used in IC packages. Although such an injected molded package is advantageous for most peripheral card applications, this package does possess certain potential drawbacks for some applications. First, if the filler material is made entirely of silica and constitutes 60 to 70% by volume of the entire molding compound, a peripheral card with an injected molded package will weigh more than a conventional card with a relatively lighter sheet metal jacket. Accordingly, when the injected molded card is inserted into certain card slots, the slot ejection mechanism may have difficulty ejecting the heavier card. Second, the relatively high weight of the silica filler material combined with the silica's relatively high brittleness may result in the card being susceptible to breakage during certain types of stress, such as when one drops the card.

Thus, a way to reduce the weight, brittleness, and warpage and optimize the stress properties of the molding compound is highly desirable. Accordingly, the general objective of the present invention is to decrease the weight, brittleness, and warpage of the molding compound while allowing one to easily balance and optimize the molding compound's, as well as the entire card's, stress, weight, brittleness, and warpage properties.

SUMMARY OF THE INVENTION

To achieve the foregoing and other objects and according to the purpose of the present invention, a portable peripheral card for an electrical device is disclosed that has an injected molded housing formed from a molding compound that includes a resin and a filler material. The filler materials includes organic polymer fibers. In one aspect of the invention, the peripheral card has a printed circuit board, an electrical connector, and a solid one-piece injected molded package. The printed circuit board has electrical components mounted thereon, and the electrical connector is attached to the printed circuit board to permit communications between the electrical components on the printed circuit board and the electrical device. The solid one-piece package encapsulates the printed circuit board and the electrical components yet exposes a portion of the electrical connector to facilitate electrical connections between the printed circuit board and the electrical device.

In one preferred embodiment, the filler's organic polymer fibers include at least one selected from the group consisting of cotton, cellulose, polyester, and nylon fibers. In another preferred embodiment, the portable peripheral card is a PCMCIA card. In another embodiment, a portion of the filler material is hollow. In another preferred embodiment, the filler material includes silica, as well as the organic polymer fibers.

In a method aspect of the invention, a method for packaging a portable peripheral card for an electronic device is disclosed. An electrical connector is attached to a printed circuit board having electrical components mounted on the board. The electrical connector forms an external connection for the electrical components mounted on the printed circuit board. The printed circuit board is positioned in the mold and a packaging material is injected into the mold to encapsulate the printed circuit board while leaving a portion of the electrical connector exposed. The packaging material is formed from a molding compound that includes a resin material and filler materials that includes a organic polymer. The packaging material is solidified to form a solid one-piece housing surrounding the printed circuit board such that a portion of the connector is exposed to permit electrical connections to the electrical device.

In another aspect of the invention, a PCMCIA card may be provided which eliminates the printed circuit board, but the packaging material is arranged to encapsulate a plurality of integrated circuits and essentially form a multi-chip package that includes a female PCMCIA connector. In another embodiment, the filler materials include silica. In another embodiment, a portion of the filler material is hollow.

BRIEF DESCRIPTION OF THE DRAWINGS

The invention, together with further objects and advantages thereof, may best be understood by reference to the following description taken in conjunction with the accompanying drawings in which:

FIG. 2 is perspective view of a PCMCIA peripheral card made in accordance with the present invention.

FIG. 3 is a diagrammatic side view of the PCMCIA peripheral card shown in FIG. 2.

DETAILED DESCRIPTION OF THE INVENTION

Figure 1:
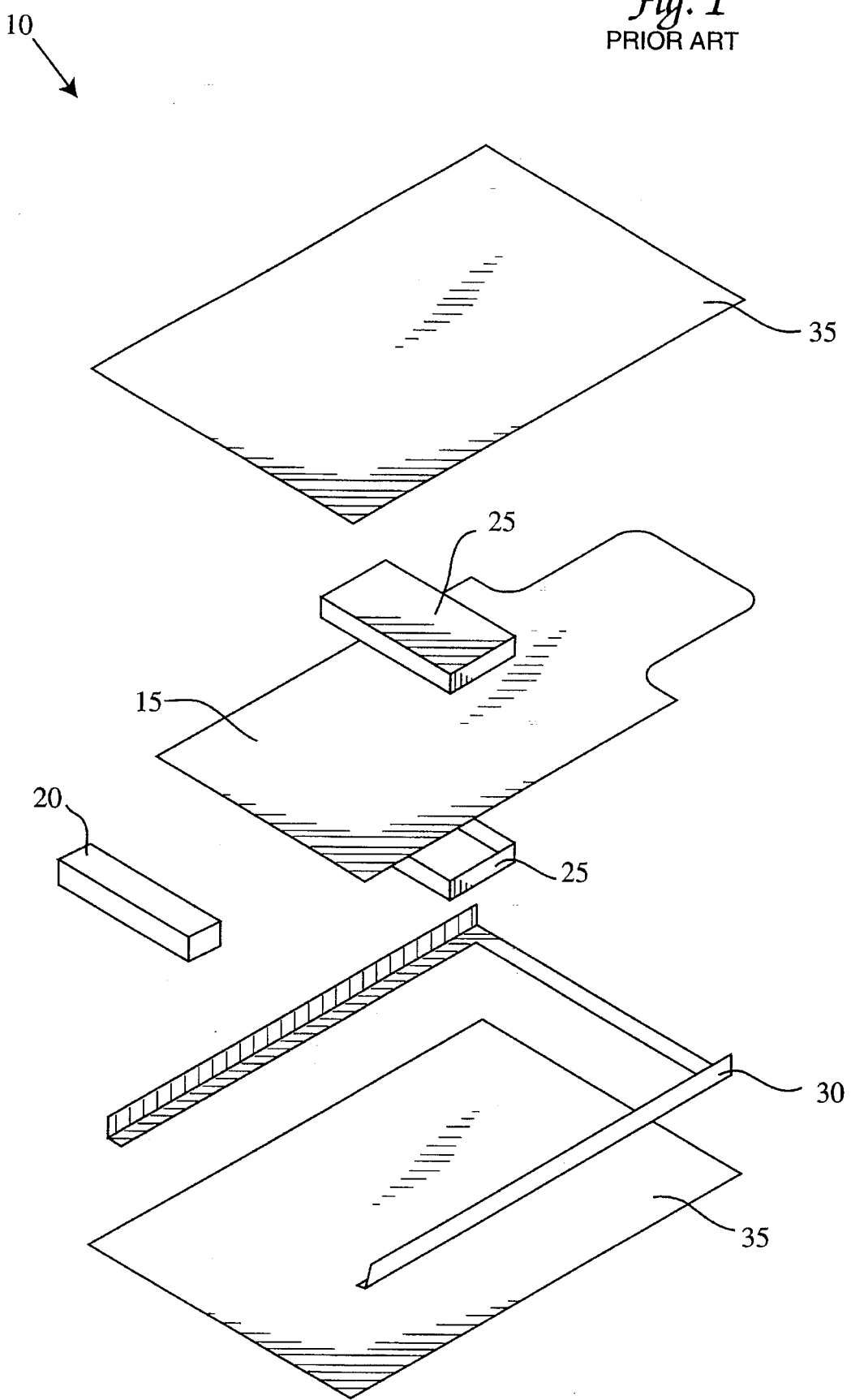
FIG. 1 is an exploded view of a conventional PCMCIA peripheral card.

A portable computer peripheral card 110 made in accordance with the present invention is shown in FIGS. 2 and 3. In the embodiment shown therein, the peripheral card conforms to the size and form requirements of a PCMCIA card. The peripheral card 110 includes a printed circuit board 115 having a plurality of components mounted thereon, a female edge connector 120 and a substantially solid one piece housing that encapsulates the printed circuit board and the components mounted thereon.

As best seen in FIG. 3, the peripheral card 110 contains a printed circuit (PC) board 115 attached to the edge connector 120 by wires 122. Various components 123 are mounted on the printed circuit board 115. The components 123 may include typical circuit components such as plastic encapsulated integrated circuits, resistors, capacitors, inductors, multi-chip packages, etc., as well as integrated circuits mounted directly on the printed circuit board 115 using conventional chip-on-board and chip-on-tape techniques. The components 123 may be mounted on either side or both sides of the circuit board 115. The embodiment shown is a wireless communicator. Thus, as best seen in FIG. 2, a tab portion 112 is provided. The tab portion is optional and indeed in most embodiments, the tab would not be provided. When present, the tab portion would typically extend outside the casing of a computer or electronic device when the peripheral card is plugged in. In the wireless communicator shown, the tab portion contains an antenna for a wireless communicator card. Of course, the tab portion could be provided with other types of cards as well when desirable.

As in conventional PCMCIA packaging technology for wireless communicators, a metal RF shield 125 may enclose some of the components 123 to prevent RF interference with the computer or electronic device. This shield 125 is generally in the portion of the card 110 that is inserted into the computer and not on the tab 112 that remains outside the computer.

A solid one-piece package 140 encapsulates the printed circuit board 115. The package material is formed from a molding compound that includes a thermoplastic or thermoset resin and filler materials. Small amounts of coupling agents, coloring agents, flame retardants, plasticizers, and wax may be optionally added to optimize the molding resin. Additionally, hardeners and catalysts may be added when thermoset resins are used. In the preferred embodiments, the filler material includes organic fibers. By way of example, suitable organic polymer fibers may include polyester, nylon, cellulose, cotton or a mixture of these materials. In a preferred embodiment, the filler material is at least 50 percent by volume of the entire molding compound, and the organic fibers are at least 10 percent by volume of the entire molding compound. By way of example, in some specific applications the filler material is between 60 and 70 percent by volume of the entire molding compound, and the organic fibers constitute between 10 and 40 percent by volume of the entire molding compound. These percentage ranges will vary with each particular application's requirements for the peripheral card's weight and stress properties which are related to the molding compound's composition.

In another preferred embodiment, a portion of the organic fibers may be hollow. By way of example, the fibers may include both hollow polyester and non-hollow cotton materials. Alternatively, the fibers may only include hollow rayon material. These examples are merely illustrative and are not to be construed as being restrictive. Additionally, this embodiment may be permuted with any other described embodiments. For example, the filler material which includes hollow and/or non-hollow organic fibers constitute between 60 and 70 percent by volume of the entire molding compound. Likewise, the hollow and/or non-hollow organic fibers constitute between 10 and 40 percent by volume of the entire molding compound.

In many embodiments, the filler materials include silica or other suitable materials in addition to the organic and/or hollow fibers. By way of example, the filler materials may include polyester and silica. The amount of each non-organic and organic material in the filler composition may vary for each particular peripheral card application. Various applications may require different values for the card's stress and weight properties. In another embodiment, a portion of the filler materials, which include the organic and inorganic fibers may be hollow. As previously noted, this embodiment may be permuted with any other embodiments. By way of example, the filler material may include non-hollow cotton, hollow polyester, hollow silica, and non-hollow silica.

The resin may be any or a variety of conventional packaging resin materials. By way of example, in one embodiment, the resin includes epoxy o-cresol novalac (ECN). In other embodiments, the resin may include Bisphenol-A or ABS. The flame retardant may take the form of any suitable flame retardant. Typically, such flame retardants include bromine and/or antimony oxide. These lists of resin and flame retardant materials are merely illustrative and are not to be construed as restrictive.

The filler that includes organic polymer fibers has several advantages over silica-only fillers. First, since the density of silica is greater than the density of most organic polymer fibers, the polymer filler has a lower weight than the silica-only filler for the same volume of filler. Thus, the entire weight of the peripheral card can be reduced by using a polymer filler. Additionally, one may balance and optimize the stress properties of the entire molding compound by varying the amounts and types of organic polymer fibers within the filler. Each filler variation will likely produce different values for the molding compound's stress properties, such as the modulus of elasticity, the coefficient of thermal expansion, and elongation. By way of example, one may balance the filler's stress properties and, therefore, optimize the molding compound's stress level on the electrical components, wires, and printed circuit board. Also, each filler and resin type variation will likely result in a different value for the molding compound's warpage properties, such as coefficient of thermal expansion (CTE) and glass transition temperature (Tg). By selecting a filler and resin type with optimal CTE and $T_g$ values, one may reduce the warpage of the PCMCIA card.

Figure 4A:
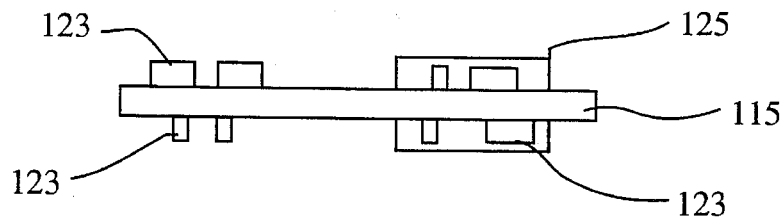
FIGS. 4a–4e are diagrammatic views illustrating steps in a method of packaging a single peripheral card in accordance with one embodiment of the present invention.

A method suitable for packaging the portable peripheral card 110 will now be described with reference to FIGS. 4a–4e. Initially, the card's components 123 are assembled on a suitable printed circuit board 115 in any suitable conventional manner as shown in FIG. 4a. An RF shield 125 may be provided as well.

The connector 120 (which may take the form of a standard female PCMCIA connector) is then attached to the printed circuit board 115 in a conventional manner. This may be accomplished in any suitable manner. By way of example, wires 122 may be extended between the printed circuit board traces and the connector 120 as shown in FIG. 4b, or the printed circuit board traces may be directly coupled to the connector 120.

Figure 4B:
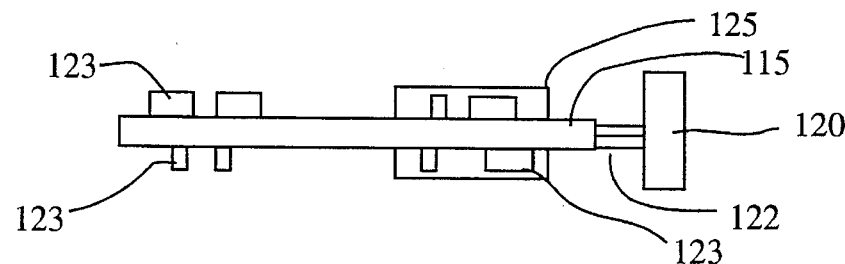
Figure 4C:
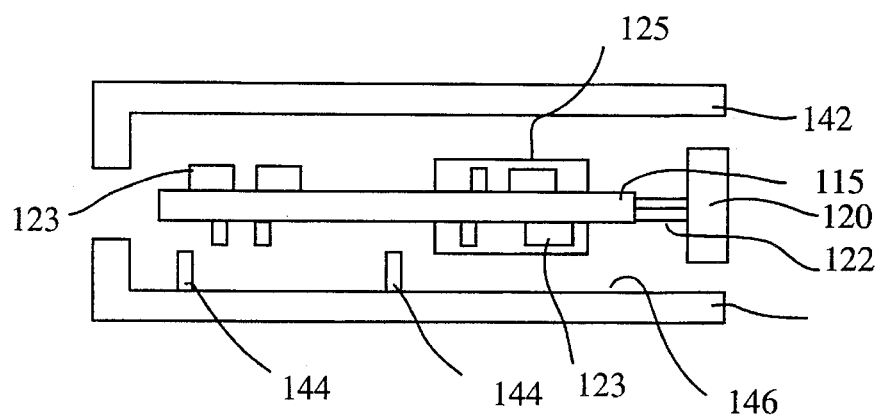

The edge connector with the printed circuit board arrangement is then positioned in a mold 142 in an open position as shown in FIG. 4c. In the embodiment shown, the portion of the edge connector 120 remains exposed outside the mold to prevent the molding material from entering the female receptacles in the connector 120.

The steps just described in relation to FIGS. 4a–c may be readily interchanged. For example, the edge connector 120 may be attached after the circuit board 115 is positioned in the mold 142. Similarly, the components 123 may be mounted onto the board 115 after the attachment of the edge connector 120 or after the positioning of the board 115 in the mold 142.

Figure 4D:
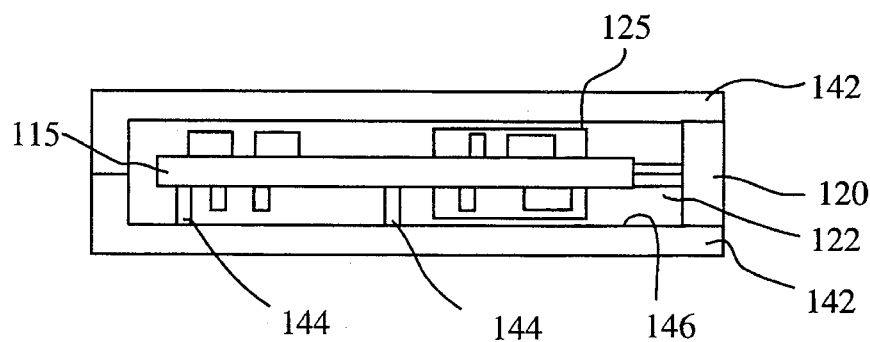

After positioning the board 115 in the mold 142, the mold is closed as illustrated in FIG. 4d, and a packaging material 140 is injected into the mold. As stated previously, the packaging material 140 is a molding compound that includes a resin and filler materials which are a mixture of silica and organic polymer fibers. The molding compound may also include small amounts of coupling agents, coloring agents, flame retardants, catalysts, plasticizers, hardeners, and wax. This injection step may be accomplished by any suitable means. By way of example, an injection or a transfer type of molding material may be used.

Figure 4E:
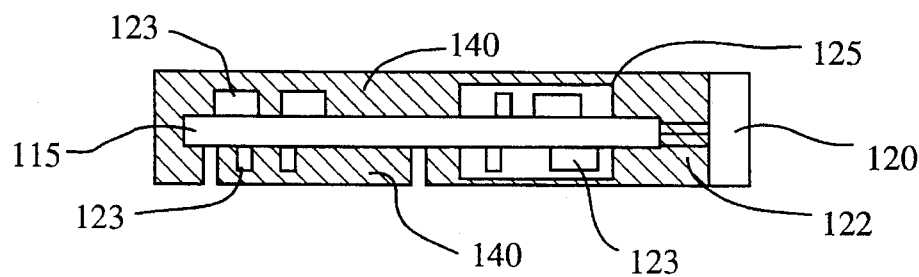

After the injection step, the packaging material 140 is solidified to form a solid one-piece housing 140 as shown in FIGS. 3 and 4e. This solidification step may merely include allowing the packaging material 140 to sit in the mold 142 until the material hardens, or it may include a sequence of steps of actively heating or cooling the packaging material 140.

Figure 5A:
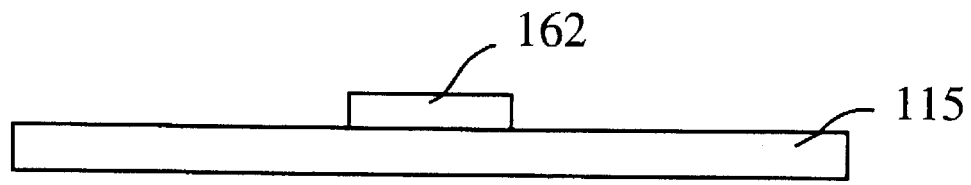
FIGS. 5a–5c are diagrammatic representations illustrating steps in a method of packaging a chip-on-board component on the printed circuit board of a peripheral card in accordance with another embodiment of the present invention.
Figure 5B:
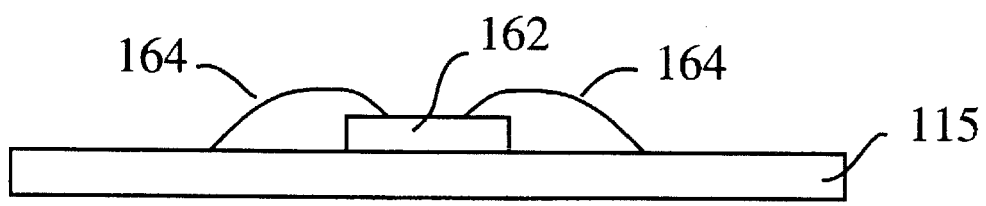
Figure 5C:
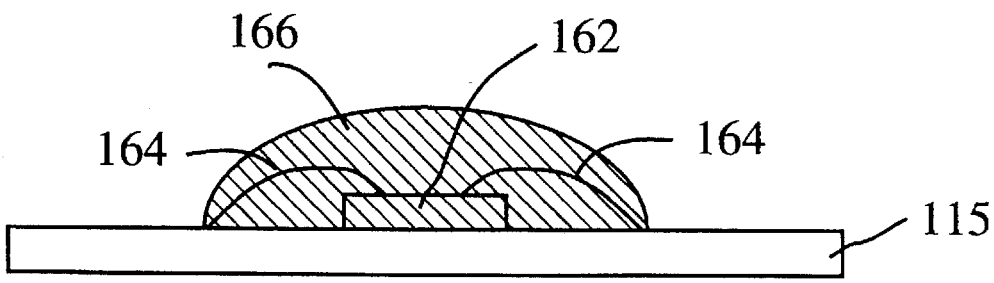

Another embodiment of the described packaging arrangement for peripheral cards is the use of chip-on-board and/or chip-on-tape connected integrated circuits. The mounting of such an integrated circuit on the printed circuit board 115 may accomplished using conventional techniques. By way of example, a suitable chip-on-board mounting scheme is diagrammatically illustrated in FIGS. 5a–c. An integrated circuit die 162 is attached to the printed circuit board 115 in FIG. 5a. To electrically connect the die 162 to the circuit board 115, bonding wires 164 are secured between die pads on the die 162 and associated traces on the printed circuit board 115 as best illustrated in FIG. 5b. To protect these wires 164 during the injection of the packaging material 140, a glob topping 166 may optionally be applied as illustrated in FIG. 5c. The peripheral card can then be packaged using either of the described methods.

In the context of the construction of a computer peripheral card 110, the steps described with reference to FIGS. 5a–c may be permuted with the positioning steps described with reference with FIGS. 4a–c. For example, the integrated circuit die 162 may be attached to the circuit board 115 after either the board 115 is positioned in the mold 142. Likewise, the steps associated with FIGS. 5b and 5c may be performed before or after the board 115 is positioned in either mold 142.

In yet further embodiments of the invention, the peripheral card may be arranged to encapsulate a plurality of components and/or integrated circuits in a manner that eliminates the need for a printed circuit board altogether. Typically, in such embodiments, the components and/or chips would be mounted on or incorporated into a substrate or other suitable support. However, this support is not necessary. In such embodiments, the various integrated circuits and the female PCMCIA connector 120 may be connected to one another in any conventional manner such as by use of a multi-chip substrate, wire bonding, the use of a leadframe, etc., to accomplish the electrical connections.

Although only a few embodiments of the present invention have been described in detail, it should be understood that the present invention may be embodied in many other specific forms without departing from the spirit or scope of the invention. Particularly, the molding compound's filler may include any number of combinations of one or more types of organic polymer fibers and/or silica materials. Additionally, the order of the steps of mounting electrical components on the circuit board, attaching the connector 120 to the PC board, and positioning the PC board or the panel in the molds may be permuted. Of course, the manner in which the ICs are packaged and/or attached to the printed circuit board or to the substrate is not important to the invention. Thus, tape automated bonding (TAB), flip chip, and bonded interconnect pin (BIP) packaging and any other suitable component packaging may be used. The printed circuit board need not be rectangular and the arrangement of circuit boards is not restricted to those shown in the figures. The panel and its circuit boards may be supported by PC boards or supports underneath the panel or molds in a wide variety of ways. For example, the outline of the mold may not be the same size as either the panel or individual printed circuit boards.

Also, although the invention has been described primarily in connection with PCMCIA peripheral cards, it has applications outside the current PCMCIA peripheral card standards. Of course the functions of the peripheral cards and the circuit components used to accomplish those functions may be widely varied to perform any particular task required. Further, when desired, the plastic packaging material may be doped with an appropriate conductor such as iron to suppress RF signals generated by a wireless communicator. This doping may obviate the need for RF shields 125. Also, metal jackets may be held against the walls of the molds by a vacuum to form outer metal surfaces of the PCMCIA cards. These jackets can facilitate discharge of static electricity and protect components of the electronic device from radiation generated by the card. In view of the foregoing, it should be apparent that the present examples are to be considered as illustrative and not restrictive, and the invention is not to be limited to the details given herein, but may be modified within the scope of the appended claims.

We claim:

1. A portable peripheral card for use with an electrical device comprising:

a printed circuit board having electrical components mounted thereon;

an electrical connector attached to the printed circuit board for permitting communications between the electrical components on the printed circuit board and the electrical device;

a solid one-piece package that encapsulates the printed circuit board and the electrical components thereon yet exposes a portion of the electrical connector to facilitate electrical connections between the printed circuit board and the electrical device, the package being formed from a molding compound that includes a resin material and filler materials, the filler materials including organic polymer fibers.

2. A portable peripheral card as recited in claim 1 wherein the organic polymer fibers includes at least one selected from the group consisting of cotton, cellulose, polyester and nylon.

3. A portable peripheral card as recited in claim 1 wherein the organic polymer fibers includes polyester.

4. A portable peripheral card as recited in claim 1 wherein the organic polymer fibers includes cotton.

5. A portable peripheral card as recited in claim 1 wherein the organic polymer fibers includes cellulose.

6. A portable peripheral card as recited in claim 1 wherein the organic polymer fibers includes nylon.

7. A portable peripheral card as recited in claim 1 wherein the filler material constitutes at least 50 percent by volume of the molding compound, and the organic polymer fibers is at least 10 percent by volume of the molding compound.

8. A portable peripheral card as recited in claim 7 wherein the filler material constitutes in the range of about 60 to about 70 percent by volume of the molding compound, and the organic polymer fibers constitute in the range of about 10 to about 40 percent by volume of the molding compound.

9. A portable peripheral card as recited in claim 1 wherein the molding compound further includes a coupling agent and a flame retardant.

10. A portable peripheral card as recited in claim 9 wherein the molding compound further includes a coloring agent, a hardener, and a catalyst.

11. A portable peripheral card as recited in claim 1 wherein said portable peripheral cards is a PCMCIA card.

12. A portable peripheral card as recited in claim 1 wherein some of the organic fibers are hollow.

13. A portable peripheral card as recited in claim 1 wherein the filler materials further include silica.

14. A portable peripheral card as recited in claim 13 wherein some of the filler materials are hollow.

15. A portable peripheral card for use with an electrical device comprising:

a printed circuit board having electrical components mounted thereon;

an electrical connector attached to the printed circuit board for permitting communications between the electrical components on the printed circuit board and the electrical device;

a solid one-piece package that encapsulates the printed circuit board and the electrical components thereon yet exposes a portion of the electrical connector to facilitate electrical connections between the printed circuit board and the electrical device, the package being formed from a molding compound that includes a resin material and filler materials, the filler materials including hollow filler components.

16. A portable peripheral card as recited in claim 15 wherein the hollow filler components constitute in the range of about 60 to about 70 percent by volume of the molding compound.

17. A method for packaging a portable peripheral card for an electronic device, the method comprising the steps of:

attaching an electrical connector to a printed circuit board having a plurality of electrical components mounted thereon, the electrical connector being attached such that the connector forms an external connection for the electrical components mounted on the printed circuit board;

positioning the printed circuit board in a mold;

injecting a packaging material into the mold to encapsulate the printed circuit board while leaving a portion of the electrical connector exposed, the packaging material being formed from a molding compound that includes a resin material and filler materials, the filler materials including organic polymer fibers; and solidifying the packaging material, whereby a solid one-piece housing surrounding the printed circuit board is formed such that a portion of the connector is exposed to permit electrical connections to the electrical device.

18. A method as recited in claim 17 wherein said portable peripheral card is a PCMCIA card.

19. A method as recited in claim 17 further comprising a step of assembling said printed circuit board.

20. A method as recited in claim 17 wherein said organic polymer includes at least one selected from the group consisting of cotton, cellulose, polyester and nylon.

21. A method as recited in claim 17 wherein the filler material constitutes at least 50 percent by volume of the molding compound, and the organic polymer is at least 10 percent by volume of the molding compound.

22. A method as recited in claim 17 wherein an array of bonding wires connects an array of input/output terminals of at least one of said electrical components to said printed circuit board, the method further including the step of providing a protective barrier over the bonding wires of said electrical components sufficient to prevent the bonding wires from moving against the force of the packaging material as the latter is injected into said mold and caused to flow over the printed circuit board.

23. A method according to claim 17 wherein the step of encapsulating the printed circuit board includes the step of providing a material transfer passage leading into said mold and wherein the step of injecting the packaging material into the mold includes the step of injecting the packaging material through the material transfer passage.

24. A portable peripheral card in accordance with claim 17 wherein said electrical components include a plurality of integrated circuit dies, the dies being mounted onto said printed circuit board.

25. A portable peripheral card in accordance with claim 17 wherein the injection step is an injection type molding process.

26. A portable peripheral card in accordance with claim 17 wherein the injection step is a transfer type molding process.

27. A method as recited in claim 17 wherein a portion of said organic polymer fibers are hollow.

28. A method as recited in claim 17 wherein said filler materials further include silica.

29. A method as recited in claim 28 wherein a portion of said filler materials are hollow.

* * * * *